United States Patent [19]

de Chambost

[11] 4,330,709
[45] May 18, 1982

[54] ELECTRONIC OPTICAL OBJECTIVE

[75] Inventor: Emmanuel de Chambost, Paris, France

[73] Assignee: Thomson-CSF, Paris, France

[21] Appl. No.: 154,911

[22] Filed: May 30, 1980

Related U.S. Application Data

[63] Continuation of Ser. No. 973,950, Dec. 28, 1978, abandoned.

[30] Foreign Application Priority Data

Jan. 3, 1978 [FR] France .............................. 78 00049

[51] Int. Cl.³ .............................................. G21K 1/08
[52] U.S. Cl. ............................ 250/396 ML; 313/431; 315/391
[58] Field of Search ................. 250/396 ML; 313/421, 313/431; 315/391

[56] References Cited

U.S. PATENT DOCUMENTS

| | | | |
|---|---|---|---|
| 3,736,423 | 5/1973 | Katagiri | 250/396 ML |
| 3,801,792 | 4/1974 | Lin | 250/398 |
| 4,162,403 | 7/1979 | Baumgarten | 250/396 ML |

Primary Examiner—Harold A. Dixon
Attorney, Agent, or Firm—Cushman, Darby & Cushman

[57] ABSTRACT

An electronic optical objective applicable to electrolithographic devices for microlithography in particular in semiconductor and integrated circuits fabrication. The objective comprises an electromagnetic lens formed by two polepieces, one of which is of soft iron and the other of ferrite, spaced from each other by an airgap. It further comprises two deflectors, one of which is placed in a longitudinal zone of weak magnetic field and the other is placed in a longitudinal zone of strong magnetic field. These two deflectors are identical and offset from each other by a certain angle, for example from 215° to 225°.

4 Claims, 4 Drawing Figures

ELECTRONIC OPTICAL OBJECTIVE

This is a continuation, of application Ser. No. 973,950 filed Dec. 28, 1978, now abandoned.

The invention relates to an electronic optical objective of use in microlithography.

Objectives employed for this purpose comprise usually an electron lens and a deflecting system comprising coils which, depending on the intensity of the electric current therein, deflect the beam in a predetermined direction, the extent of this deflection being preferably a predetermined linear and increasing function of this intensity. Known objectives have certain drawbacks. In particular, they are the cause of aberrations and the eddy current increases the response time. Lastly, they are not linear. The objective according to the invention in large part avoids these drawbacks.

According to the invention, there is provided an electronic optical objective comprising a magnetic lens of revolution which is capable of forming on its optical axis an axial magnetic field which varies from its input pupil to its output pupil, and at least one deflector formed by magnetic coils which create a magnetic field of variable intensity which is the cause of the deflection of the electron beam in a given direction, the objective further comprising two coil systems placed respectively close to the input pupil and close to the output pupil, the two systems being identical and angularly offset from each other by a certain angle $\theta$, the polepieces of the lens comprising an element of soft iron and an element of ferrite spaced apart by an airgap.

According to another aspect of the invention, there is provided an objective wherein the first system is placed in a region where the axial field is of the order of one tenth of its maximum value, and the second system is placed in a region where it is of the order of one half of said value, the axial field increasing from the input pupil to the output pupil with a relatively small slope and reaching its maximum value in the immediate vicinity of the output pupil and being zero in the plane of said pupil.

A better understanding of the invention will be had from the ensuing description with reference to the accompanying drawings in which:

FIG. 1 is a sectional view of the electronic objective according to the invention.

Figure 1:
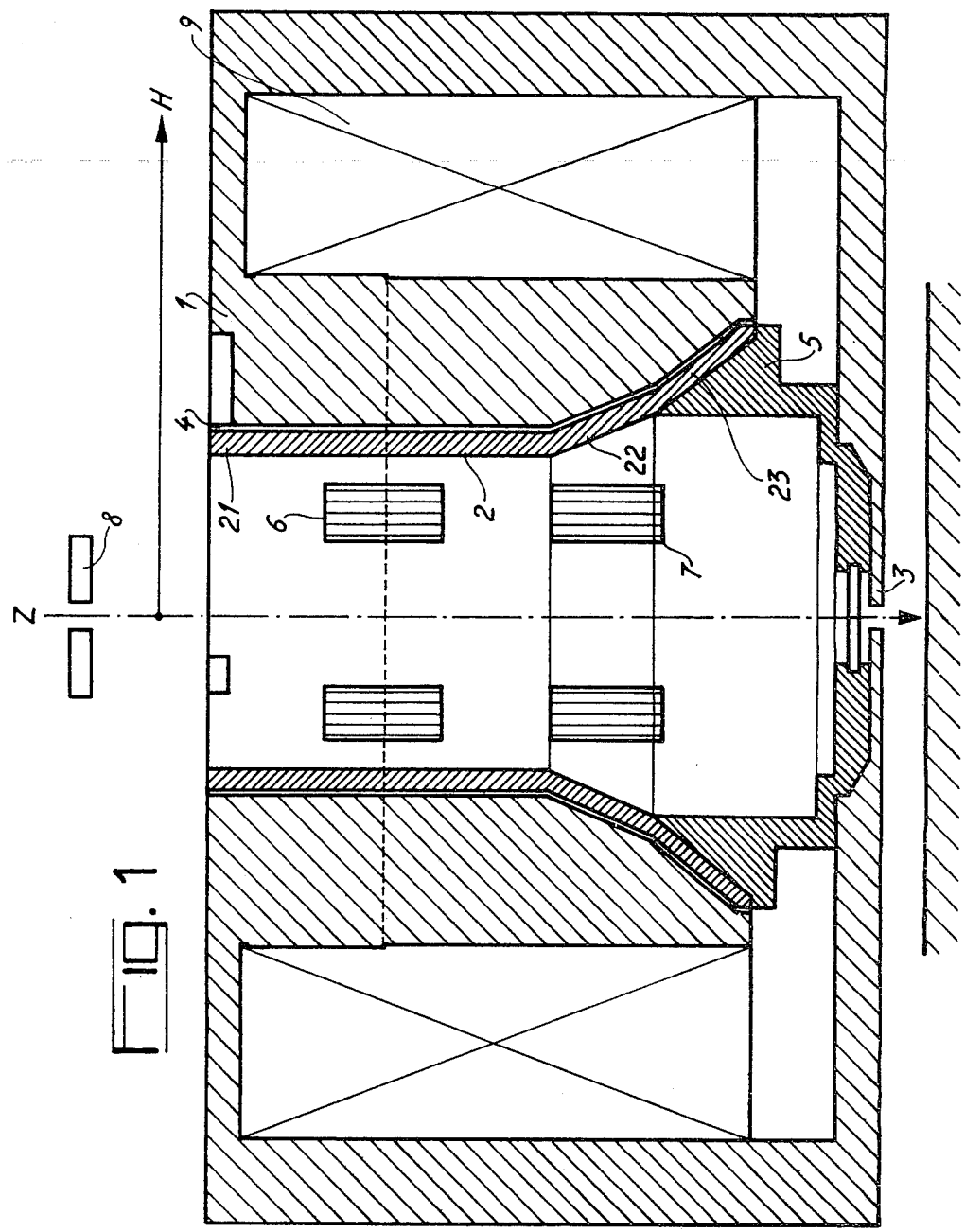
FIG. 1 represents a cross-section of the objective according to the invention.

This objective is of revolution about its axis z z'. It comprises a core in two parts 1 and 2, one part surrounding the other.

The inner part 2 is of ferrite and has a cylindrical portion 21 which is connected to two frustoconical portions 22 and 23 forming a divergent part in the vicinity of its output pupil 3.

The outer part 1 of soft iron marries up with the shape of the part 2. It is separated therefrom by an airgap 4 and closes onto the output pupil. The output pupil is carried by support 5 of duralumin which is itself carried by the lower part of the polepiece.

According to the invention, two magnetic deflectors 6 and 7 are provided, the deflector 6 being placed in the upstream part in the portion 21 of the lens and the other deflector 7 being placed in the region of the frustoconical portion 22.

A diaphragm 8 located at the input of the objective limits the aperture of the electron beam.

The two deflectors are each formed by an assembly of coils created a magnetic field perpendicular to the axis z z'.

A coil 9 is wound around the parts 1 and 2.

Figure 2:
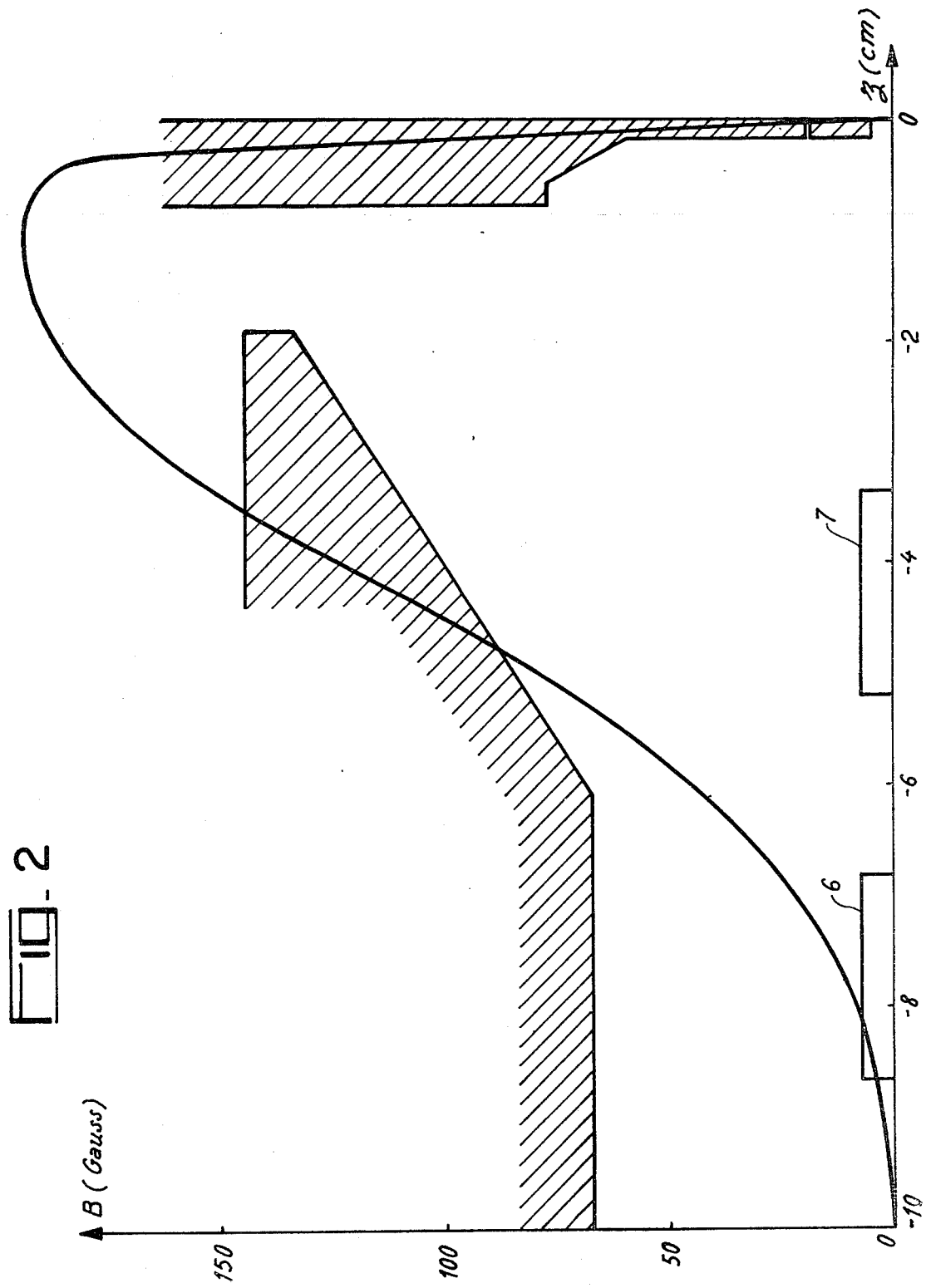
FIG. 2 represents the curve of variation of the axial magnetic field along the optical axis of the lens and the respective positions of the two deflectors on this axis.

FIG. 2 represents, in a non-limitative example, the variation of the intensity B of the magnetic field created by the lens along the axis of the later, the origin $z=0$ being in the plane of the output pupil 3, the abscissae being in centimeters and the ordinates in Gauss. It can be seen that the two deflectors are placed so that the deflector 6 is upstream in the region where the field does not exceed 10 Gauss, and the other deflector 7 is downstream in a region where the field varies between 100 and 200 Gauss.

Figure 3:
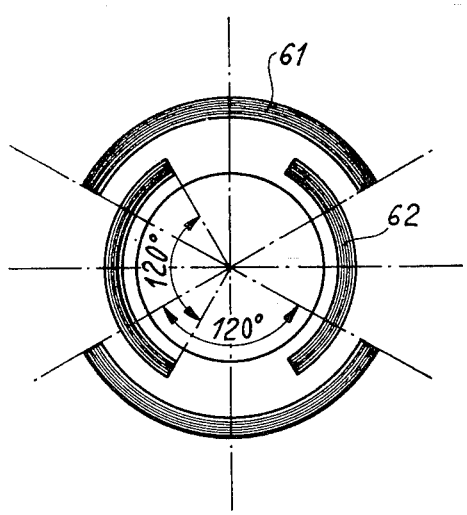
FIG. 3 represents in plan an embodiment of a deflector utilized in the device according to the invention.
Figure 4:
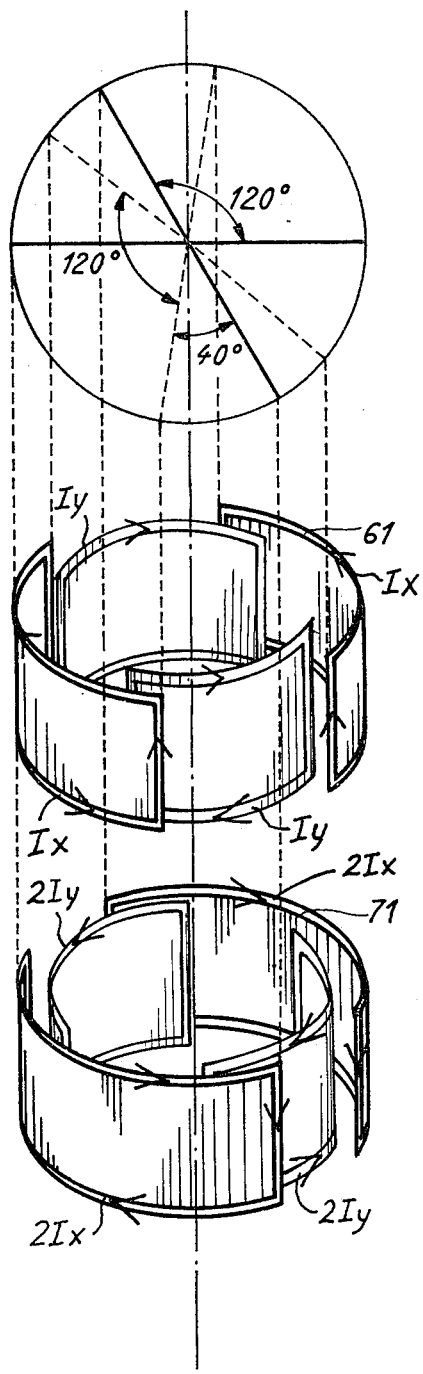
FIG. 4 represents a side view of the two deflectors showing their respective angular offsets.

The maximum value of the field after a relatively small increasing slope reaches its maximum value at 300 Gauss in the vicinity of $z=-1$ cm and drops to zero where $Z=0$. This being so, FIG. 3 is a top plan view of one of the deflectors, the other deflector being identical and FIG. 4 is a perspective view of the two deflectors. For reasons of clarity, only a part of each deflector has been shown in FIG. 4.

Each deflector comprises (FIG. 3) two parts 61 and 62, 71 and 72, one of which is for scanning in x and the other for scanning in y. Each part is divided into two coils which are symmetrical relative to the axis z z' and disposed in series. Each of these coils is wound as shown in FIG. 4 around a portion of a cylinder of revolution subtending an angle of 120° C.

The two parts are disposed in such manner that their transverse axes of symmetry are perpendicular to each other.

In one embodiment, the height of the cylinders is the same, namely 3 cm, the diameter of the inner cylinder is of the order of 2.4 cm and that of the outer cylinder is of the order of 5 cm.

Each semi-deflector 61 or 62, 71 or 72 carries a variable current. The currents in the coils 61-71, 62-72 (not shown in FIG. 4) are respectively proportional to the amplitudes of deflection of the beam along the two axes Ox and Oy which are perpendicular to each other, the assembly forming with the axis z z' a reference trirectangular trihedral and the axes Ox and Oy being located in the plane of the object to be scanned.

FIG. 4 shows that the two deflectors are offset by an angle $\theta=180°+\alpha$, $\alpha$ being between 35° and 45°. The ratio of the intensities in the two deflectors is constant and substantially equal to 2.

Tests and calculation have shown that the objective according to the invention has the following advantages:

(a) The spacing of the ferrite part 2 from the metal part 1 avoids eddy currents which retard the establishment of the magnetic field in the middle of each deflector in the case where a current pulse is applied to the two coils.

On the other hand, the presence of the polepiece of soft iron prevents any saturation of the ferrite piece in the case where the lens is highly convergent.

(b) The deflection by two successive deflecting stages and their respective angular offset minimizes aberrations, particularly in the case where the upper deflector is in the region where the axial field is weak, the second being in a region where the axial field is strong. The latter must be sufficiently remote from the output pupil and from the iron polepieces so that the transverse field it creates does not close onto the lower polepiece.

What I claim is:

1. An electronic optical objective comprising a magnetic lens of revolution for receiving an electron beam along its optical axis, said lens being capable of forming on said optical axis an axial magnetic field which varies from its input pupil to its output pupil, and at least one deflector for creating a magnetic field of variable intensity in order to deflect the electron beam in a given direction, said at least one deflector comprising two magnetic coil systems placed respectively close to the input pupil and close to the output pupil, the two coil systems being identical and made up of four coils in quadrature, the coils in each system being angularly offset from the corresponding coil in the other system by a certain angle $\theta$, other than 90°, said lens including polepieces comprising an element of soft iron and an element of ferrite spaced apart by an airgap.

2. An objective as claimed in claim 1, wherein the first system is placed in a region where the axial field is of the order of one tenth of its maximum value, and the second system is placed in a region where it is of the order of one half of said value, the axial field increasing from the input pupil to the output pupil with a relatively small slope and reaching its maximum value in the immediate vicinity of the output pupil and being zero in the plane of said pupil.

3. An objective as claimed in claim 1, wherein the angle $\theta$ is between 215° and 225°.

4. An electronic optical objective comprising a magnetic lens of revolution for receiving an electron beam along its optical axis, said lens being capable of forming on said optical axis an axial magnetic field which varies from its input pupil to its output pupil, and at least one deflector for creating a magnetic field of variable intensity in order to deflect the electron beam in a given direction, said at least one deflector comprising two magnetic coil systems placed respectively close to the input pupil and close to the output pupil, the two coil systems being identical and angularly offset from each other by a certain angle $\theta$, between 215° and 225°, said lens including polepieces comprising an element of soft iron and an element of ferrite spaced apart by an airgap.

* * * * *